United States Patent
Suzuki (10) Patent No.: US 8,101,920 B2
(45) Date of Patent: Jan. 24, 2012

(54) SPIN ISOLATION APPARATUS, SPIN ASYMMETRIC MATERIAL PRODUCING METHOD, CURRENT SOURCE, AND SIGNAL PROCESSING METHOD

(76) Inventor: Takashi Suzuki, Yokohama (JP)

( * ) Notice: Subject to any disclaimer, the term of this patent is extended or adjusted under 35 U.S.C. 154(b) by 219 days.

(21) Appl. No.: 12/087,152

(22) PCT Filed: Dec. 27, 2006

(86) PCT No.: PCT/JP2006/326127
§ 371 (c)(1),
(2), (4) Date: Jun. 27, 2008

(87) PCT Pub. No.: WO2007/077890
PCT Pub. Date: Jul. 12, 2007

(65) Prior Publication Data
US 2009/0107895 A1 Apr. 30, 2009

(30) Foreign Application Priority Data
Dec. 28, 2005 (WO) .................. PCT/JP2005/024266

(51) Int. Cl.
*G21K 1/093* (2006.01)
*C23C 14/04* (2006.01)

(52) U.S. Cl. .................. 250/398; 250/492.1; 250/492.3; 250/251

(58) Field of Classification Search .................. None
See application file for complete search history.

(56) References Cited

U.S. PATENT DOCUMENTS

| | | | | |
|---|---|---|---|---|
| 3,113,207 A | * | 12/1963 | Bederson et al. | 250/296 |
| 3,461,294 A | | 8/1969 | Von Ehrenstein et al. | |
| 6,054,708 A | * | 4/2000 | Shimizu | 250/251 |
| 2002/0036281 A1 | | 3/2002 | Akinaga et al. | |

FOREIGN PATENT DOCUMENTS

| | | |
|---|---|---|
| JP | A-60-14432 | 1/1985 |
| JP | A-10-247599 | 9/1998 |
| JP | A-11-340835 | 12/1999 |
| JP | A-2001-313236 | 11/2001 |
| JP | A-2002-80299 | 3/2002 |
| JP | 2005167119 A * | 6/2005 |
| JP | A-2005-167119 | 6/2005 |

OTHER PUBLICATIONS

Fiederling et al., "Injection and detection of a spin-polarized current in a light-emitting diode," *Nature*, vol. 402, Dec. 1999, pp. 787-789.
Bohm, "Quantum Theory," 1951, Preface, pp. 100-101, 362-363, 404-405 and 592-599.

(Continued)

*Primary Examiner* — Jack Berman
(74) *Attorney, Agent, or Firm* — Oliff & Berridge, PLC (57) ABSTRACT

A spin isolation apparatus comprising a particle source for emitting particles having spins, a receiving section for receiving the particles emitted by the particle source, a magnet for separating the particles into first particles having positive spins and second particles having negative spins, and a trajectory restricting section for isolating the first and the second particles received by the receiving section through restricting trajectories of the first particles and/or the second particles is provided. By applying this apparatus, particles having spins whose every sign is either one of the two signs can be mass-produced.

6 Claims, 6 Drawing Sheets

OTHER PUBLICATIONS

Ohno et al., "Electrical spin injection in a ferromagnetic semiconductor heterostructure," *Nature*, vol. 402, Dec. 1999, pp. 790-792.

Kaloyerou, "On the Wootters-Zurek Development of Einstein's Two-Slit Experiment", Foundations of Physics, vol. 22, No. 11, 1992. Plenum Press, pp. 1345-1377.

Mar. 2, 2011 Supplementary European Search Report issued in European Patent Application No. 06843509.8.

Fiederling et al., "Injection and detection of a spin-polarized current in a light-emitting diode," *Nature*, vol. 402, Dec. 1999, pp. 787-789.

Gerlach et al., "Der experimentelle Nachweis der Richtungsquantelung im Magnetfeld," *Zeitschrift für Physik*, 1922, pp. 349-352.

Gerlach et al., "Das magnetische Moment des Silberatoms," *Zeitschrift Für Physik*, 1922, pp. 353-355.

Gerlach et al., "Über die Richtungsquantelung im Magnetfeld," *Annalen Der Physik*, No. 16, 1924, pp. 673-699.

Bohm, "Quantum Theory," 1951, Preface, pp. 100-101, 362-363, 404-405 and 592-599.

Ezawa, "The development of the quantum theory and paradoxes," *Quantam Mechanics and New Technology*, 1987, Chapter 10.

Ohno et al., "Electrical spin injection in a ferromagnetic semiconductor heterostructure," *Nature*, vol. 402, Dec. 1999, pp. 790-792.

Dec. 6, 2011 Office Action issued in Japanese Patent Application No. 2007-552968 (with translation).

\* cited by examiner

SPIN ISOLATION APPARATUS, SPIN ASYMMETRIC MATERIAL PRODUCING METHOD, CURRENT SOURCE, AND SIGNAL PROCESSING METHOD

This is a National Phase of Application No. PCT/JP2006/326127 filed Dec. 27, 2006, which claims priority of International Application No. PCT/JP2005/024266 filed Dec. 28, 2005. The disclosure of the prior applications is hereby incorporated by reference herein in its entirety.

TECHNICAL FIELD

This invention relates to an apparatus for dividing individual particles having spins into two groups each of which contains particles having spins whose every sign is plus or minus, a method for producing a material including particles having spins whose every sign is plus or minus more than particles having spins of another sign different from the sign of spins of the former particles, a current source supplying electrons having spins whose every sign is plus or minus, and a method for processing electric signals comprised of electrons having spins whose every sign is plus or minus.

BACKGROUND ART

It is well known that spins of individual material particles are involved with magnetic characteristics of substances. Those substances having magnetic characteristics such as various magnets are used as raw materials for producing devices and apparatuses indispensable for industry. Further, a new field of electronics called spin electronics or spintronics has been remarked in recent years. In these fields, it is intended to develop new magnetic materials and semiconductors by applying technologies for controlling not only charges but also spins of electrons. As an example of such technologies, it can be mentioned that a giant magneto-resistance effect is obtained by applying an artificial lattice structure of a metal in which atomic deposition in the normal direction to the stratified layers is artificially controlled. This technology has been applied in producing a GMR head as a magnetic head. Recently, development of MRAM as a nonvolatile magnetic memory is energetically advanced.

[Non-patent Reference 1] W. Gerlach and O. Stern, Z. Phys. Vol. 9, 349 (1922).
[Non-patent Reference 2] ibid. 353 (1922).
[Non-patent Reference 3] Ann. Phys. Vol. 74, 673 (1924).
[Non-patent Reference 4] D. Bohm, Quantum Theory (Prentice-Hall, Englewood Cliffs, N.J., 1951).
[Non-patent Reference 5] H. Ezawa, "Chap. 10 The development of the quantum theory and paradoxes" in Quantum Mechanics and New Technology, ed. by Physical Society of Japan (Baifukan, Tokyo, 1987) (in Japanese).

DISCLOSURE OF THE INVENTION

Task to Be Solved by the Invention

When ultimately going ahead with the above technologies for controlling spins, we get a technology, as an unprecedented idea, for producing particles having spins of only either one of the plus and minus signs separately from each other. When isolation of each individual particle with the spin of every specified sign becomes possible, it also becomes possible to create a new material that has never existed in the natural world by applying particles having spins of only either one of the two signs.

Solution for the Task

According to a first aspect of the present invention, there is provided a spin isolation apparatus which isolates particles each having a spin based on a sign of the spin of each of the particles, the apparatus comprising a particle source which emits the particles; a receiving section which receives the particles emitted by the particle source, a magnet which has two magnet poles arranged apart from each other with a prescribed gap and which is placed between the particle source and the receiving section and which separates the particles into first particles each having a spin of a positive sign and second particles each having a spin of a negative sign, and a trajectory restricting section which is placed between the particle source and the receiving section which restricts the trajectories of at least one of the first particles and the second particles to isolate the first and second particles received by the receiving section.

According to the first aspect of this invention, individual particles having spins can be separated and isolated based on the sign of each spin and the isolated particles each having the spin of a specific sign do not mix with other isolated particles each having the spin of the other sign. Accordingly, each of isolated particles can be independently extracted as a particle having the spin of the plus sign or of the minus sign. A particle source in this invention means an apparatus that emits particle beam such as, for example, silver atomic beam or neutron beam. Moreover, placing, for example, a slit-collimator comprised of two slit apertures separated from each other with a certain distance between the magnet and the particle source, the particle beam can be adjusted like parallel rays of light. Further, the magnet in this invention may be an electromagnet (like, for example, an electromagnet used in the Stern-Gerlach experiment) or a permanent magnet. When particles are for instance silver atoms, an insulator plate can be used as the receiving section. Incidentally, in this invention, "to isolate individual particles" does not restricted only to the case when two types of particles can be completely separated without any mixing with each other. For example, if the two types of particles could not be completely separated, these particles can be regarded as "divided into two" provided that the number of particles of one type is larger than the number of particles of the other type.

In the spin isolation apparatus of this invention, the trajectory restricting section may be a screen having a predetermined aperture and may be placed between the magnet and the receiving section. In this case, since the first particles and the second particles arrived at the receiving section can certainly be separated, there is no fear that these two types of particles may mix with each other.

In the spin isolation apparatus of this invention, the trajectory restricting section may be such a conductive wire, which connects the particle source and the receiving section, which is placed in the gap between the magnet poles, and which branches into two wires at the gap between the magnet poles. In this case, when the particles should be charged particles such as, for example, electrons, since there is no fear that the trajectories may be turned toward the outside of the magnet due to Lorentz forces, the first particles and the second particles can be surely separated.

In the spin isolation apparatus of this invention, the particles each having the spin may be electrons, the receiving section may include storage devices and the magnet can be an electromagnet. In this case, one of the electrons having positive spins and the electrons having negative spins can be stored more than another of the electrons in each storage device.

In the spin isolation apparatus of this invention, the particles each having the spin may be neutrons, the receiving section may be formed by a neutron absorber. In this case, since only neutrons having spins of positive signs or negative signs can be absorbed in the neutron absorber, a spin characteristic (e.g., a magnetic characteristic) of the material that has absorbed neutrons can be altered.

According to the second aspect of this invention, there is provided a method for producing a spin asymmetric substance in which a number of particles each having a positive spin and a number of particles each having negative spins are different, the method including: arranging, side by side, a particle source which emits a beam of particles each having a spin, a magnet having two magnet poles arranged with a predetermined gap, and a substance; emitting the particles having the spin from the particle source; separating the particles each having the spin into the particles each having the positive spin and the particles each having the negative spin by making the particles each having the spin pass through the gap of defined in the magnet; and injecting, into the substance, one of the particles each having the positive spin and the particles each having the negative spin such that the one of the particles is injected more than the other of the particles.

According to the second aspect of this invention, injecting particles having positive spins or particles having negative spins into a material can easily alter physical properties (e.g., magnetic properties) of this material. And it is also possible to produce a condenser containing one of the two types of electrons, that is, the electrons having positive spins and the electrons having negative spins, more than another type of the electrons by injecting one of the two types of the electrons more than another type of the electrons into a capacitor included in the condenser as the material in this invention.

According to the third aspect of this invention, there is provided a current source comprising a plurality of first electrons each having a positive spin; a plurality of second electrons each having a negative spin; a storage section which stores the first and second electrons; and electrodes which output the first and second electrons, wherein a number of the first electrons stored in the storage section and a number of the second electrons stored in the storage section are different from each other.

According to the third aspect of this invention, for example, applying the current source supplying electrons having either one of the positive spins or negative spins as the particle source in the second aspect of this invention, it becomes possible to supply electrons having either one of the higher purity positive spins or negative spins.

According to the fourth aspect of this invention, there is provided a signal processing method comprising: forming the first electric signal with a first electron having a positive spin and forming a second electric signal with a second electron having negative spins.

According to the fourth aspect of this invention, an electric signal provided by the signal processing method of this invention can deal with a large quantity of information simultaneously, because this electric signal includes information of spins in addition to information of whether or not electrons exist.

The signal processing method of this invention may further include forming a compound signal that is compounded from the first electric signal and the second electric signal and decomposing the compound signal into the first electric signal and the second electric signal. In this case, since compounding and/or decomposing signals are freely carried out, these two signals can be dealt with by compressing into one signal.

Effect of the Invention

According to this invention, since particles having positive spins and/or particles having negative spins can be injected into a material, magnetic characteristics of the material can easily be altered.

BRIEF DESCRIPTION OF THE DRAWINGS

FIGS. 5A and 5B are diagrams each illustrating an assembly in which a conductive branched wire shown in FIG. 3 and a magnet are assembled together on a substrate. FIG. 5A shows the case in which a permanent magnet is utilized and FIG. 5B shows the case in which an electromagnet is applied.

LEGENDS OF REFERENCE NUMERALS

Best Mode for Carrying Out the Invention

Figure 6:
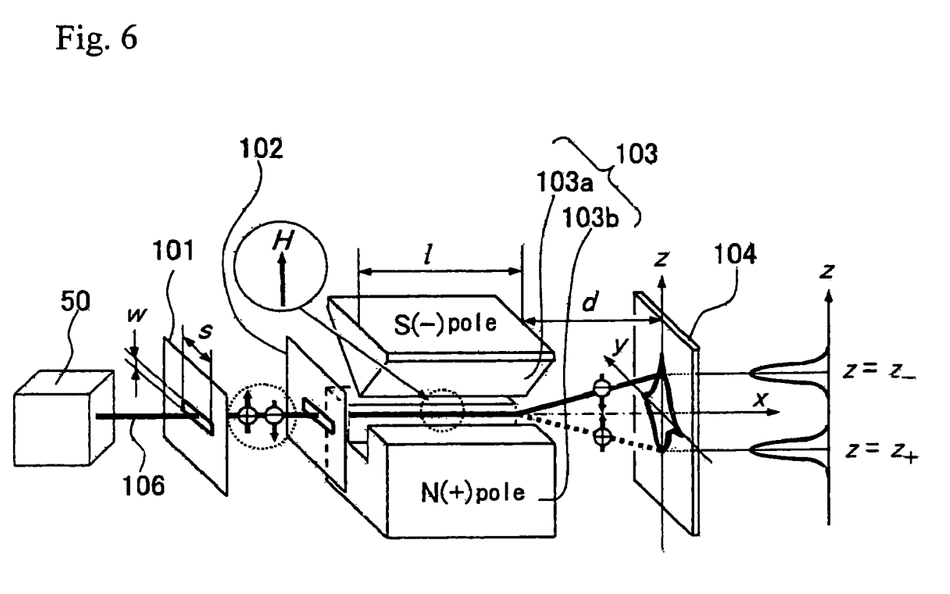
FIG. 6 is a schematic diagram illustrating the Stern-Gerlach experimental apparatus.

When we call an apparatus, for producing individual particles each having a spin of the positive sign and individual particles each having a spin of the negative sign separately, as a spin isolation apparatus in short, an apparatus used in the Stern-Gerlach experiment can be reminded as an existent apparatus similar to the spin isolation apparatus (Refer to FIG. 6). Before describing the spin isolation apparatus of this invention in detail, the Stern-Gerlach-experiment and the apparatus used in the experiment will be shortly explained below.

FIG. 6 is a schematic diagram illustrating the apparatus used in the Stern-Gerlach experiment (Refer to Non-patent References 1 through 3). Since the shapes of pole tips of the N and S poles are extremely different from each other, a strongly inhomogeneous magnetic field is generated. With regard to silver atomic beams emitted from an electric furnace 50, tracks of the silver atomic beam traveling on the x axis were illustrated according to the drawings by Bohm in the Non-patent Reference 4 (Refer to FIG. 1 in page 593 and FIG. 2 in page 598). However, according to the same Non-patent Reference 4, a trajectory of each individual microscopic particle in motion has been considered not possible to exist like in classical mechanics because of the uncertainty principle (In pages 100-101 in the Non-patent Reference 4, the following description stating that the momentum and position of every particle cannot even exist with simultaneously and perfectly defined values is seen. If so, it turns out that every particle has no trajectory.)

A silver atomic beam 106 emitted from an aperture of an electric furnace (particle source) 50 is collimated by passing through slit apertures of the same shape each cut in two screens 101 and 102 both placed with a certain separation and the resulted atomic beam of a cross section that is laterally long (in the direction of the y axis) impinges on an electromagnet. The aperture opened in each of the individual screens 101 and 102 has the length s=0.8 mm in the direction along the y axis and the width w=0.03~0.04 mm in the direction along the z axis. Since the shapes of magnet poles (103a and 103b) of an electromagnet 103 extremely lack the symmetry with respect to the xy plane, silver atoms arrived at a glass plate 104 (observation plane) draw a specific evaporation pattern. That is, this evaporation pattern extremely lacks, as shown in FIG. 2B, the symmetry with respect to the y axis although that is symmetric with respect to the z axis. The separation between the pattern drawn by the silver atomic rays each having − spin and the pattern drawn by the silver atomic rays each having + spin in the direction of the z axis becomes maximum ($\Delta z = z_- - z_+ \sim 0.20$ mm) on the z axis getting narrower with larger distance from the z axis and, finally, these two patterns are overlapped with each other.

According to Non-patent Reference 4, since each individual silver atom passes through the region between the two magnet poles instantaneously, the force working to the atom in this region is assumed to be neglected. Further, the x motion of the atom is dealt with by assuming as having the velocity v in accordance with classical mechanics, while the z motion parallel to the magnetic field is assumed to be dealt with quantum mechanically. According to the figure shown in the paper by Stern and Gerlach (FIG. 1 in Non-patent Reference 3), the magnet pole length l in the direction along the x axis is about 10 times longer than the distance d (supposed to be ~3 mm), that is, the distance from the magnet poles to the observation plane shown in FIG. 6. Although the track of the silver atomic beam drawn according to the figure by Bohm does not split while the beam passes through the electromagnet, it splits into two tracks towards different directions as soon as it gets out of the electromagnet. Because each silver atom should rather be affected by the magnetic field only during its passing through the gap between the magnet poles, the track of the silver atomic beam shown in FIG. 6 is unnatural. However, since Bohm's textbook for quantum mechanics is the first one that has dealt with the Stern-Gerlach experiment, the behavior of each silver atom in this experiment will be described according to Bohm for the time being. For simplicity, we deal with only the motion in the xz plane in the following. As for the initial condition, each individual silver atom is assumed to exist at the entrance of the electromagnet when t=0. This means that the origin of a local coordinate system exists on the x axis at the entrance of the electromagnet.

The Hamiltonian of the interaction between a silver atom and the magnetic flux density B in this experiment can be expressed as follows:

$$H_1 = \mu(\sigma \cdot B) = \mu \begin{pmatrix} B_z & B_x - iB_y \\ B_x + iB_y & -B_z \end{pmatrix} \quad [\text{Eq. 1}]$$

where σ represents a spin operator (Refer to Non-patent Reference 4, p. 405, Eq. (75)).

Here, let the absolute value of electronic charge, the mass of an electron, Planck's constant, and the velocity of light be e, m, h, and c respectively, the magnetic moment μ of the electron is written as follows:

$$\mu = -\frac{e\hbar}{2mc} < 0 \quad [\text{Eq. 2}]$$

where the reduced Planck's constant is defined by the following Eq. 3:

$$\hbar = \frac{h}{2\pi} \quad [\text{Eq. 3}]$$

In Eq. 1, the x component of B can be ignored and, because the magnetic field is symmetric with respect to the xz plane, the y component of B also becomes zero. Further, the highly inhomogeneous magnetic field can be approximated as follows (Refer to Non-patent Reference 4, page 594):

$$B_z \approx B_0 + zB'_0 \quad [\text{Eq. 4}]$$

In the above Eq. 4, $B_0$ represents the magnetic flux density on the x axis (Refer to Non-patent Reference 4, p. 594) and $B_0'$ is written by $$B_0' = \left(\frac{\partial B_z}{\partial z}\right)_{z=0} \quad [\text{Eq. 5}]$$

From these equations, the Hamiltonian of the interaction, Eq. 1, can be expressed as $$H_I \approx \mu(B_0 + zB'_0)\sigma_z \quad [\text{Eq. 6}]$$

Here, with the use of the Pauli spin matrix, the z component of a spin is written as follows:

$$s_z = \frac{\hbar}{2}\sigma_z = \frac{\hbar}{2}\begin{pmatrix} 1 & 0 \\ 0 & -1 \end{pmatrix} \quad [\text{Eq. 7}]$$

While the purpose of the Stern-Gerlach experiment was to measure the magnetic moment of a nucleus of each silver atom, it had turned out that actually measured was the magnetic moment of an electron given by Eq. 7. Since this magnetic moment is a physical quantity associated with the electronic spin, this measurement can be regarded as the measurement of the electronic spin $s_z$. According to Non-patent Reference 4, with the use of $B_0$ given by Eq. 5, the magnetic moment μ expressed by Eq. 2, and the time Δt that is necessary for each silver atom to pass through the gap between the magnet poles, the position of a silver atom having + spin and the position of a silver atom having − spin both on the z axis are represented respectively as follows (Refer to Non-patent Reference 4, page 597, Eq. (18)):

$$z_+ = -\frac{B_0' \mu \Delta t}{\hbar} t > 0, \quad [\text{Eq. 8}]$$

$$z_- \frac{B_0' \mu \Delta t}{\hbar} t < 0$$

Here, as shown in FIG. 6, when the length of the electromagnet in the direction along the x axis is represented by l and the velocity of each atom in the direction along the x axis by v, it gives Δt=l/v. However, this inventor indicates that this equation involves two points of errors shown below. One is the sign and another is the difference between the dimensions of both sides of this equation. Although the dimension of the numerator is J·m$^{-1}$·s$^2$, since that of the denominator is J·s, the dimension of z becomes m$^{-1}$·s resulting in having no dimension of a length.

Referring to Non-patent Reference 5 (pages 204-242; Concerning the analysis of the Stern-Gerlach experiment, refer to pages 221-225) in which results of detailed analysis on the Stern-Gerlach experiment are described, the above problem will be reexamined.

As the original article will be referred to for details, only the main points will be described in the following: The wave function $\psi_{+out}$ that is concerned with the up spin (+spin) and gets out of the electromagnet, represents the state of a silver atom having the momentum p whose x component (px), y component (py), and z component (py) are given respectively as follows:

$$p_x = \hbar k,$$
$$p_y = 0,$$
$$p_z = \frac{\hbar \mu B'_0 l}{2E}$$
[Eq. 9]

Here, E denotes the average of kinetic energy of each individual silver atom that is emitted from a furnace with the temperature 1320 K or, more exactly, 1323 K. This wave function $\psi_{+out}$ has got the additional downward momentum $\Delta p_z$ in comparison with the wave function $\psi_{+in}$ incident on the electromagnet. This downward momentum $\Delta p_z$ is represented by the following equation:

$$\Delta p_z = \frac{\hbar \mu B'_0 l}{2E}$$
[Eq. 10]

In contrast, the wave function that is concerned with the down spin and gets out of the electromagnet has got the additional upward momentum $-\Delta p_z$ in comparison with the wave function $\psi_{+in}$ incident on the electromagnet. This shows that the wave representing a silver atom passing through the gap between the magnet poles splits into a component curving down and another component curving up in accordance with the spin of the atom. However, it is known that these momentum variations$\pm \Delta p\_$also agree with those predicted by classical mechanics. These momentum variations derived by applying classical mechanics result as follows:

$$\pm \Delta p_z = \pm \frac{\mu B'_0 l \cdot \hbar k}{2E} \approx \mp 1.2 \times 10^{-24} \text{kg} \cdot m \cdot s^{-2}$$
[Eq. 11]

The average wavelength of de Broglie waves associated with silver atoms incident on the slit (the width w equals 0.03~0.04 mm) set up in each of individual screens 101 and 102 becomes, with the use of $\lambda=px/h$, 6.7×10-6 µm. If the width of the slit is 0.03 mm, this width is about 4.5×106 times of the average wavelength of de Broglie waves. Here, taking into account that the length l of each magnet pole in the direction along the x axis is about 3 cm, the distance D (Refer to FIG. 1) from a screen 2 to the observation plane can be supposed to be about 3.5 cm (Refer to Non-patent Reference 3, FIG. 1). Therefore, the diffraction of a wave associated with each of individual silver atoms caused by the slit can be ignored on this plane. Because being able to ignore this diffraction means to be able to ignore the wave nature of each individual silver atom, it may be considered that the abovementioned split of each wave actually corresponds to the split of the atomic rays. The inventor of this invention changed the discussion on this item based on the uncertainty principle in Non-patent Reference 5 into more fundamental discussions based on the diffraction phenomena.

Each individual atom moving on the x axis collides with the glass plate after its passing through the gap between the magnet poles. It will be tried to calculate $\Delta z=z_- - z_+$ by assuming that the observation plane is positioned at the exit of the magnet poles. According to the results of the analysis described above, since each silver atom with the mass M may be allowed to approximately draw either trajectories of parabolas, we readily obtain from Eq. (6) the following equation (Here, we used $\mu=-0.93 \times 10^{-23}$ J/T, $(B_0 \sim 1.8$ T,$)$ $B_0' \sim -2.4 \times 10^3$ T/m, $l=3 \times 10^{-2}$ m, $v \sim 5.5 \times 10^2$ m/s, and $M=1.8 \times 10^{-25}$ kg):

$$\Delta z = 2 \times \frac{|\Delta p_z|}{M} \frac{l}{v} = -2 \frac{\mu B'_0 (\Delta t)^2}{2M} \approx 0.36 \text{ mm}, \left(\Delta t = \frac{l}{v}\right)$$
[Eq. 12]

Figure 1:
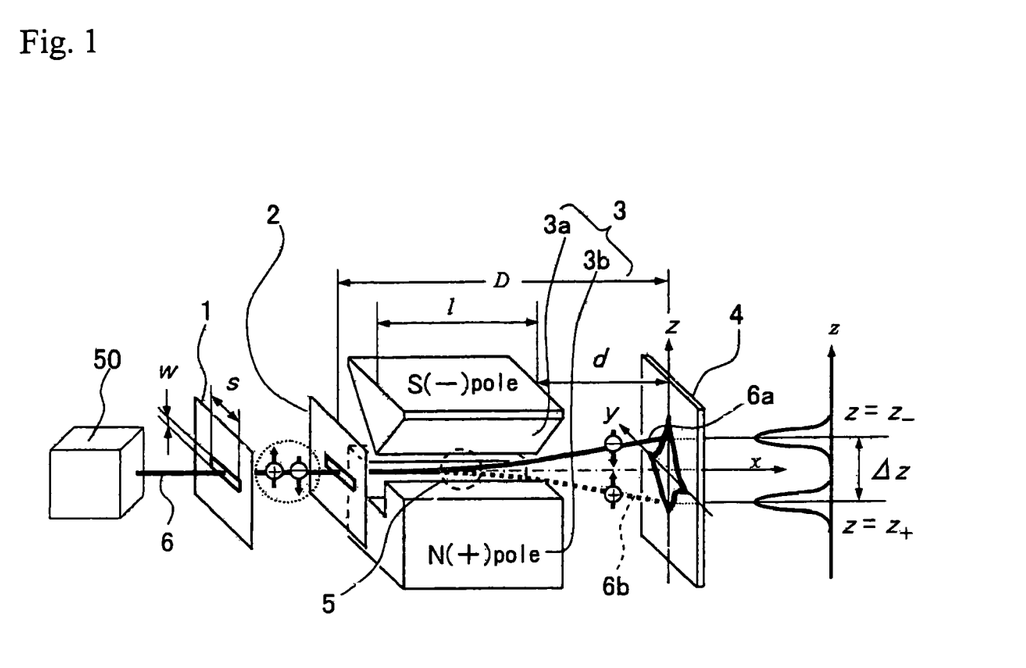
FIG. 1 is a schematic diagram illustrating a situation of a silver atomic beam splitting into two in the gap of magnet poles in an apparatus for the Stern-Gerlach experiment.
Figure 2:
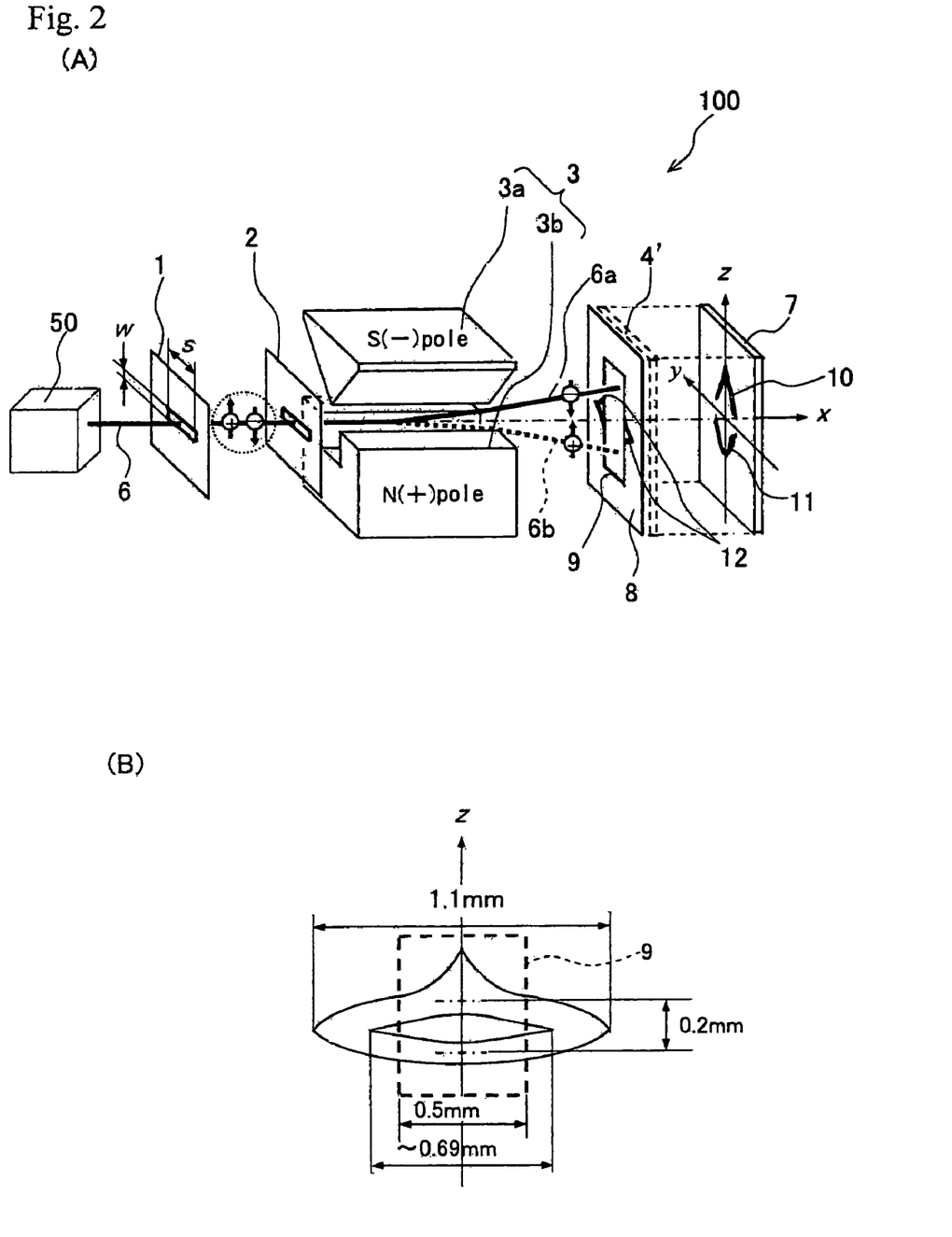
FIG. 2A is a diagram illustrating a mask having a rectangular aperture placed just before the glass plate in the Stern-Gerlach experimental apparatus and FIG. 2B is a diagram illustrating an example of the positional relationship between the rectangular aperture and the evaporation pattern.

Taking the above result of analysis done by the inventor of this invention into consideration, the schematic diagram of the Stern-Gerlach experiment shown in FIG. 6 becomes as shown in FIG. 2. But, for the convenience of easily looking at the evaporation pattern, the distance d between magnet poles 3a and 3b and a grass plate 4 (observation plane) has been depicted rather distantly. These are actually close to each other and it gives about d~3 mm. Incidentally, since $\Delta z$~0.20 mm was obtained on the surface of the glass plate in the Stern-Gerlach experiment, the result of Eq. 12 shows good agreement with the experiment even though applying the considerably approximate formula. The largest difference obtained by comparing FIG. 1 and FIG. 6 exists in the trajectory of a silver atomic beam. Although the silver atomic beam 106 does not split until it goes out of the electromagnet in FIG. 6, it is seen in FIG. 1 that a silver atomic beam 6 emitted by the particle source 50 begins to split into two beams 6a and 6b around the region encircled by a circle 5 written by a broken line and completely split at the exit of an electromagnet 3.

In Non-patent Reference 5, it was described that, for example, one must not classical mechanically consider as if a silver atom with down spin curves up by receiving upward forces during its passing through the gap between the magnet poles. This is because, according to quantum mechanics, since the reduction of a wave packet takes place at the moment when each silver atom collides with the glass plate, the silver atom should probabilistically be detected only at either one of the two positions $z=z_-$ and $z=z_+$ at that moment of collision. In other word, it means that the silver atom in the state of superposition of the two different spins must not be considered as having either one of the two spins before its detection. However, this analysis conforming to quantum mechanics apparently has no consistency with the results of analysis described above. Because, it has been described in the analysis above that "these momentum variations $\pm \Delta p_z$ also agree with those predicted by classical mechanics". If so, in any case wherever the detection plane is placed at the exit or inside of the gap between the magnetic poles, as long as the silver atomic rays split into the two, the experimental result that should be obtained is in the form that each single atom detected at $z=z_->0$ necessarily has a − spin and that detected at $z=z_+<0$ always has a + spin. Actually, this result had been obtained in the Stern-Gerlach experiment, so that it is quite allowable to argue this problem classical mechanically.

Further, also in Non-patent Reference 5, the following idea was introduced: Let the two waves split up and down once by the electromagnet superpose again by making them pass through another pair of magnetic poles etc. without any intermediate observation on the glass plate. Then, by observing whether or not interference occurs, it will be seen whether or not the reduction of a wave packet occurs at first on the glass plate. However, as seen from FIG. 1, since any silver atom with a + spin can never be found out in the wave that has split and curved upward, interference will never occur even if the split waves could be superposed again. In other words for confirmation, for a single silver atom to occur interference, a probability wave itself representing the silver atom must be split into two. If so, since the probability wave representing the superposition of states of two spins propagates along the two split paths, a silver atom having + spin for example should be possible to be detected at $z=z_-$ or at $z=z_+$. However, in the experiment, each silver atom having + spin is always detected at $z=z_+<0$ and is never detected at $z=z_->0$. Accordingly, the interference never occurs and it can be affirmed that the individual split waves are not the probability waves each representing the superposition of states. As shown above, this result of experiment that can be explained by applying classical mechanics can never be explained by applying quantum mechanics. Therefore, we will solve this problem by applying classical mechanics although this application is an approximation after all in the sense that the wave property is ignored.

The forces working to a silver atom in the magnetic field are given as follows (Refer to Non-patent Reference 4, page 326, Eq. (68)):

$$F = \mu \nabla(\sigma \cdot B) \quad [\text{Eq. 13}]$$

In the case of this experiment, applying Eq. (5) etc. that are used in Non-patent Reference 4 to approximately describe the interaction between a silver atom and the magnetic fields in the gap of the magnet poles, the above equation can be written as follows:

$$F_z = \mu \frac{\partial B_z}{\partial z} \sigma_z \doteq \mu B_0' \sigma_z \quad [\text{Eq. 14}]$$

Since the direction of $B_0'$ is coincident with that of the magnetic flux density $B_0$, an atom with $\sigma_z=1$, that is, the up spin, receives downward forces and an atom with $\sigma_z=-1$, that is, the down spin, receives upward forces. Here, on the x axis shown in FIG. 1, since the origin of space-time coordinates is temporarily fixed to the entrance of the electromagnet 3, the Newtonian equation of motion in the direction along the z axis for a silver atom in the gap of the magnet poles is, with the use of the mass M of a silver atom, given by the following equation:

$$M \frac{\partial^2 z(t)}{\partial t^2} = F_z \quad [\text{Eq. 15}]$$

On the other hand, since $x=vt$, the trajectories of individual atoms from the entrance to the exit of the electromagnet 3 are determined according to the initial conditions set temporarily and the above equation in the xz plane as the two parabolas symmetrical with respect to the x axis as shown below:

$$z = \pm \frac{\mu B_0'}{2Mv^2} x^2 \quad [\text{Eq. 16}]$$

Denoting the length of magnetic poles 3a and 3b in the direction along the x axis as l, the z coordinates of individual atoms at the exit of the electromagnet are written by the following equations:

$$z = \pm \frac{\mu B_0'}{2Mv^2} l^2 \quad [\text{Eq. 17}]$$

And, from the gradients of tangential lines at $x=l$ of the parabolas Eq. 16, it is seen that the z components $v_z$ of the velocities are expressed as follows:

$$v_z = \pm \frac{\mu B_0' l}{Mv} \quad [\text{Eq. 18}]$$

In addition, denoting the distance from the exit of electromagnet 3 to the observation plane 4 as d, the time taken by an atom moving from the exit to this plane 4 becomes d/v. Eventually, the positions of individual atoms on the observation plane 4 are given by the following equations:

$$z_\pm = \pm \frac{\mu B_0' l^2}{2Mv^2} + v_z \frac{d}{v} = \pm \frac{\mu B_0' l^2}{2Mv^2} \pm \frac{\mu B_0' l d}{Mv^2} = \pm \frac{\mu B_0' l}{Mv^2}\left(\frac{l}{2} + d\right) \quad [\text{Eq. 19}]$$

Substituting $d=0$ and $\Delta t=l/v$ in the above equations, the z coordinates of individual atoms at the exit of electromagnet 3 are expressed as follows:

$$z_+ = \frac{\mu B_0'(\Delta t)^2}{2M} < 0, \quad [\text{Eq. 20}]$$

$$z_- = -\frac{\mu B_0'(\Delta t)^2}{2M} > 0$$

It is seen that $\Delta z=z_- - z_+$ represented by the use of Eq. (20) agrees with Eq. (12). Further, it is also seen from the comparison of Eq. (20) and Eq. (8) that there exist errors on the signs mentioned above in Eq. (8). In this way, as far as the Stern-Gerlach experiment, it is supposed that silver atoms having up spins received downward forces draw the trajectories 6b and silver atoms having down spins received upward forces draw the trajectories 6a and, consequently, positions, on the glass plate (observation plane) 4, at which the individual silver atoms arrive can be predicted classical mechanically.

As shown above, it turned out that each individual silver atom having up spin and each individual atom having down spin could be separately taken out. By the way, the reason why a silver atomic spin is identical with an electronic spin is considered that the silver atomic spin is caused by a 5 s electron in the outermost shell of the silver atom. As shown in FIG. 1, the pattern of evaporated silver atoms having down spins and the pattern of evaporated silver atoms having up spins are symmetric with respect to the z axis and are connected with each other at both ends of each of these patterns overlapped on the y axis in the observation plane (plane surface of the glass plate). Since silver is a good conductor, 5 s electrons having spins of different signs are mutually mixed as free electrons with the lapse of time. Consequently, it is not possible to produce a thin film of the silver consisting only of silver atoms having spins of either one of the two signs separately. Thus, this inventor found out that "the apparatus used in the Stern-Gerlach experiment itself could not be applied as a spin isolation apparatus".

First Embodiment

FIG. 2A is a schematic diagram of a spin isolation apparatus 100 of this invention for isolating individual particles having spins whose every sign is either one of the two different signs. Taking the case of silver atoms as particles having spins will provide explanations in this embodiment. The position of an outline 4' traced by dotted lines in FIG. 2A corresponds to the position where the glass plate 4 was placed in FIG. 1. The mask (screen) 8 is placed just before the plate 7 placed at the position of the outline 4'. This mask has a rectangular aperture 9. As shown in FIG. 2B, the breadth of the exterior outline of the evaporation pattern was 1.1 mm in the case of the Stern-Gerlach experimental apparatus (Refer to Non-patent Reference 1, FIG. 5). Accordingly, supposing that the breadth of the interior outline of the evaporation pattern was ~0.7 mm, the width of the aperture 9 in the direction along the y axis should, for example, be determined as 0.5 mm. According to the spin isolation apparatus 100 of this invention, the thin film 10 of silver having − spin and the thin film 11 of silver having + spin are separately obtained spatially on the plate (receiving section) 7 over which the mask (trajectory restricting section) 8 is newly provided. Further, the evaporation pattern 12 including thin film parts of silver evaporated in a mixture of silver atoms having − spins and silver atoms having + spins is remained on the mask 8. For making the above separation complete, the aperture 9 can be divided into two apertures by providing a narrow screen parallel to the y axis as the need arises.

Although the method for separating the evaporation pattern by providing the mask 8 just in front of the plate 7 was explained in the above, another method without using the mask 8 exists for enabling this separation. A slit of the width w and length s is located on each of the two screens 1 and 2 that constitute a slit-collimator. Making the length s of the slit short for making the width of the evaporated pattern on the plate shorter than the width of the aperture 9 on the mask 8 also results this separation of the evaporated pattern.

In this embodiment, particles to which the spin isolation apparatus can be applied are not restricted to silver atoms. For example, when the particle source 50 (silver atomic source) should be replaced by a neutron source in FIG. 2A, neutrons can be divided into neutrons having − spins and neutrons having + spins. Accordingly, if we use a neutron absorbing material (a neutron absorber) as the plate 7 and implant for example neutrons having − spins, we can get a material much having − spins (spin asymmetric material). Similarly, we can get a material much having + spins. These materials including the above-mentioned thin films of silver, which have new physical characteristics and have been unknown so far, can be utilized as raw materials for producing various new devices that are useful for industry.

Second Embodiment

In case of the spin isolation apparatus in the first embodiment, the spin isolation is impossible for charged particles such as electrons. This is because, since Lorentz forces in the direction along the y axis acts on a charged particle moving in the gap between magnet poles, the particle should be expelled from the gap between the magnet poles. For the sake of spin isolation for charged particles, a spin isolation apparatus shown below will be useful.

Figure 3:
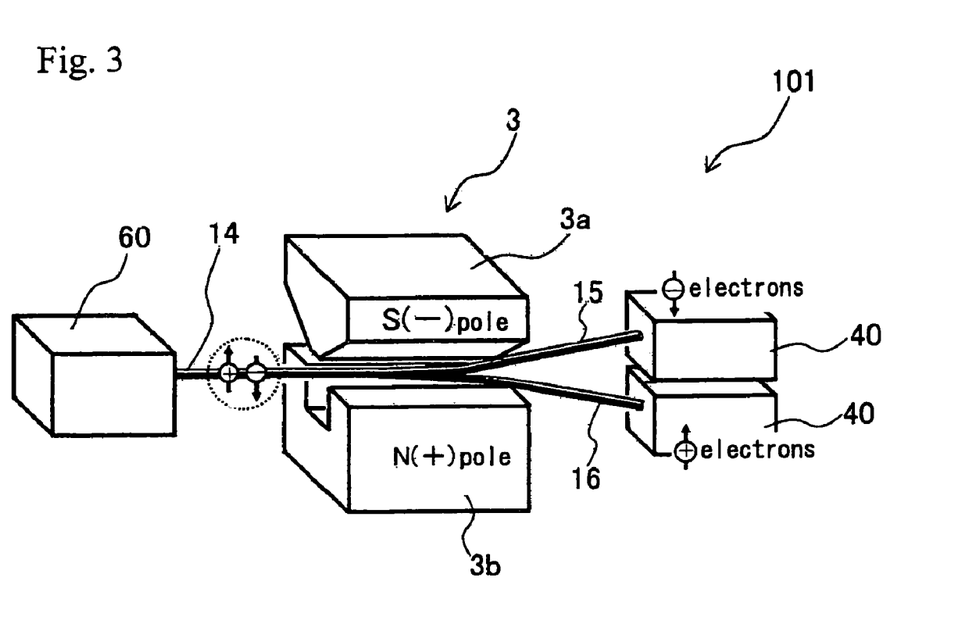
FIG. 3 is a schematic diagram illustrating an apparatus for mass production of electrons having either one of the positive spins or negative spins associated with magnetic moment.

FIG. 3 shows an apparatus for isolating electrons having spins whose every sign is one of the two signs from electrons having spins of mixed signs as a spin isolation apparatus 101 in this embodiment. This apparatus comprises a direct-current source 60, the electromagnet 3, and a conducting wire (trajectory restricting section) 14 that is produced by a conductor such as copper, aluminum, etc., and is passed through between the two magnet poles, an S pole 3a and an N pole 3b, of the electromagnet. This conducting wire 14 branches into two conducting wires 15 and 16 before it goes out of the space in which magnetic fields are formed by the magnet poles and individual branched wires are connected to storage devices 40 such as condensers, capacitors, etc., for storing electrons.

In the next, explanations will be given to a procedure for isolating each individual electron in accordance with the sign of its spin by applying the spin isolating apparatus 101 illustrated in FIG. 3. A current is supplied to the conducting wire 14 from the direct-current source 60. Electrons having − spins and electrons having + spins are contained almost half and half in this current. When these electrons pass through the gap between the magnet poles, each individual electron having − spin is attracted by the S pole, passes through the S-pole side of the conducting wire 14, flows into a branched wire 15, and is stored in a storage device 40. On the other hand, each individual electron having + spin is attracted by the N pole, passes through the N-pole side of the conducting wire 14, flows into a branched wire 16, and is stored in a storage device 40. In this way, electrons having − spins and electrons having + spins are mass-produced separately from each other. Accordingly, the spin isolating apparatus in this embodiment works as a single-spin-electron producing apparatus. In addition, each storage device 40 has a storage unit in which electrons individually having spins whose every sign is + or − have stored more than electrons having spins whose every sign is different from the sign of a spin of each of individual former electrons. This storage device 40 can be utilized as a (direct) current source supplying electrons including electrons having spins of one sign much more than electrons having spins of the other sign.

In the above single-spin-electron producing apparatus, the electromagnet can be replaced by a permanent magnet. Further, for enhancing a purity of spins of electrons stored in individual storage devices 40, it is suitable for example to connect either one of the storage devices which once stored electrons having spins whose every sign is one of the two signs more than electrons having spins whose every sign is another of the two signs to this apparatus again as a direct-current source. Alternatively, it is also appropriate to connect this apparatus comprising the conducting wire 14 and a following to each of the branched wires 15 and 16. In addition to the above, there is a method to make the conducting wire 14 be branched into three wires and let those electrons that cannot be isolated enough and have mixed spins be released into the central branched wire. The electrons having + or − spins thus mass-produced can directly be supplied to an apparatus not shown in figures for changing the characteristic of a material instead of storing in the storage device 40. When a material including particles having spins is a fluid such as a gas, a liquid, etc., a hollow tube branching at the middle thereof can be used instead of the conducting wire 14 branching on the way as shown in FIG. 3.

In this way, electrons having + spins or electrons having − spins both produced abundantly and cheaply can individually be utilized for altering a usual material into a material having either one of the + or − spins more than another spins (spin asymmetric material) by upsetting the balance of the physical property of the original spin neutral material through applying various physical processes, chemical processes, and/or physicochemical processes, in each of which, for example, the above either electrons are combined with the spin neutral material. In case of applying physical processes, electrons having either one of the + or − spins can be directly injected into each individual object material as an electron beam or a current. When a material is a metal having conductivity such as Al, Cu, Ag or the like, it is easy to produce a metallic material having free electrons of positive spins by directly supplying, for example, only electrons having positive spins as a current resulting in replacing free electrons in the above metal with the electrons having positive spins. As a physicochemical process, an application of the electrolysis of a fused salt (NaCl) can be exemplified. It is known that metallic sodium will be produced on the cathode in the electrolysis of NaCl. In case of utilizing this process, supplying each individual electron $e^-_+$ having + spin as a current, a reaction described by $Na^+ + e^-_+ \rightarrow Na_+$ occurs on the cathode and each individual metallic sodium $Na_+$ having + spin will be obtained. In contrast, when each individual electron $e^-_-$ having − spin is supplied, each individual metallic sodium $Na_-$ having − spin will be obtained. Incidentally, the material that is neutral with respect to spins is not restricted to a solid but may be a liquid or a gas.

In the above, explanations have given to apparatus that isolate particles having only specific spins from each of various types of particles having spins. Further, it has also been explained that these particles having specific spins can be utilized to alter a physical property of materials. These new materials can be applied as materials for forming parts of individual types of apparatus and devices. Therefore, it becomes possible in advance to set basic design items concerning what material should be select as the object, what process can be applied to alter the physical property of the object material, and what particles having which spins should be used in the process. Especially, electrons having spins of either one of the + and − signs can effectively used for designingly alter a physical or chemical property of a material selected as the object. However, it is necessary to pay attention to a possibility of the case in which the material having either one of the + and − spins much more than another spins thus obtained is in general difficult to stably hold its state a long time in comparison with spin neutral materials.

Third Embodiment

Individual electrons can be used as carriers of signals. Since applying electrons having spins of either one of the two signs to form signals means to newly get a magnetically controlling electric signals in addition to the known method of an electrical controlling, a field of application will be opened also in the information processing technology.

An example of a quite new information processing technology using carriers of individual electrons each having either one of the two types of spins will be explained in the following with reference to FIGS. 4A and 4B.

Figure 4:
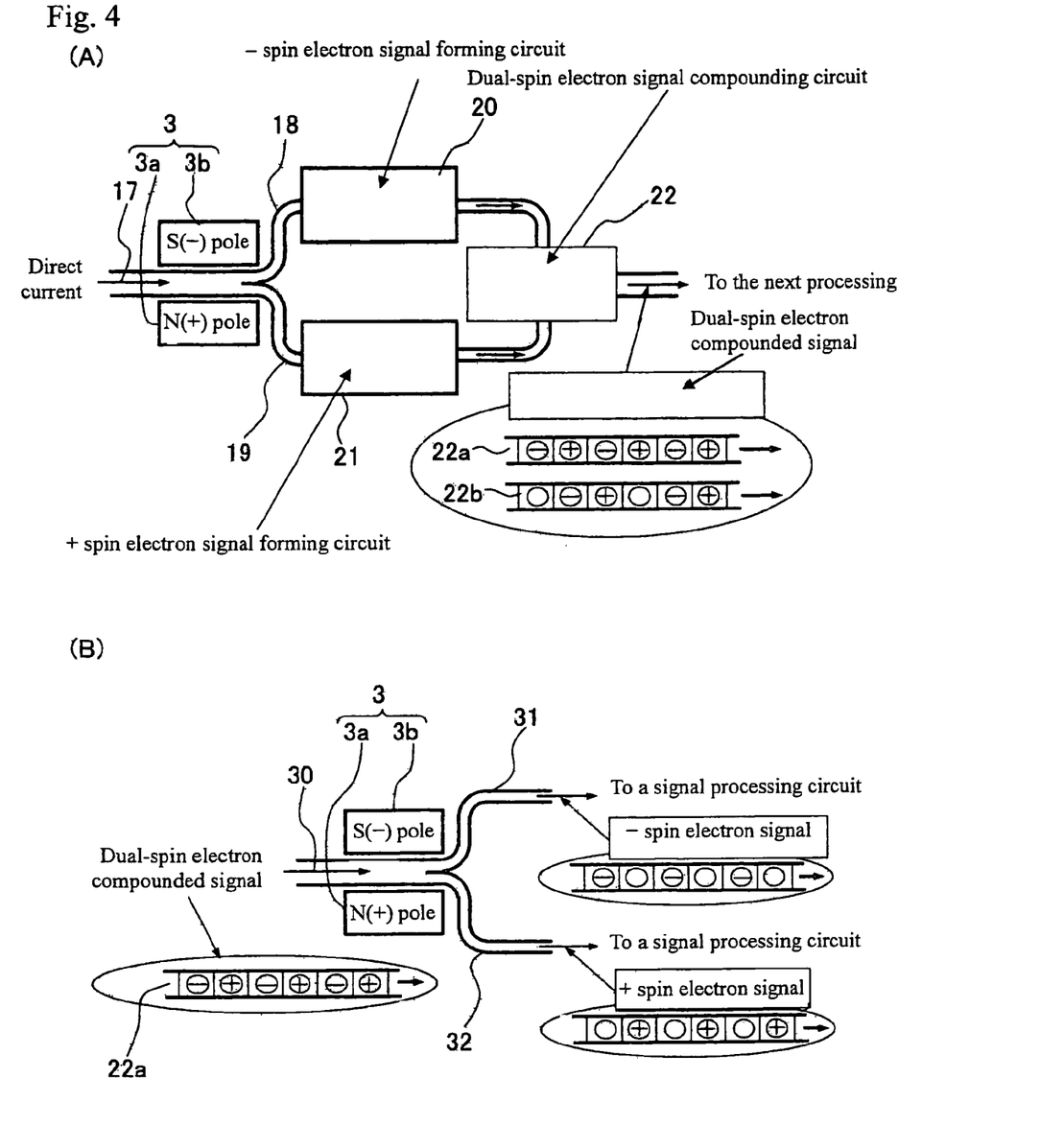
FIG. 4A illustrates a circuit for compounding a signal comprised of electrons having positive spins and another signal comprised of electrons having negative spins together (dual-spin electron signal compounding circuit) and FIG. 4B illustrates a circuit for dividing the compounded signal into signals each comprised of electrons having either one of the positive spins and negative spins.

FIGS. 4A and 4B show diagrams illustrating a signal processing technology using two types of electrons having spins whose every sign is either + or −. FIG. 4A illustrates a step for compounding a signal comprised of electrons having positive spins and another signal comprised of electrons having negative spins together resulting in one compounded signal and FIG. 4B illustrates another step for dividing the above compounded signal into signals each comprised of electrons having either one of the positive spins and negative spins.

In FIG. 4A, a current comprised of electrons having − spins, which is a part of a direct current inputted into a conducting wire 17, flows into a branched wire 18 and a current comprising electrons having +spins, which is another part of the direct current inputted into the conducting wire 17, flows into a branched wire 19 at the middle of the passage between magnet poles of the electromagnet 3. A signal forming circuit 20 outputs digital signals whose each individual bit comprises more than one electron having a − spin. The outputted digital signals are inputted into a dual-spin electron signal compounding circuit 22. A signal forming circuit 21 into which a current having + spins flowed into the branched wire 19 is inputted outputs a digital signal whose each individual bit comprises more than one electron having a + spin and the output digital signal is inputted into the dual-spin electron signal compounding circuit 22. By the way, there is a method in which electrons having + spins stored in the + spin electron storing device shown in FIG. 3 are supplied to the + spin electron signal forming circuit 21 and electrons having − spins stored in the − spin electron storing device shown in FIG. 3 are supplied to the − spin electron signal forming circuit 20. The dual-spin electron signal compounding circuit 22 into which the + spin electron signal and the − spin electron signal are inputted outputs a compound signal that comprises electrons having both spins and is compounded from the + spin electron signal and the − spin electron signal. Explanations will be given to dual-spin electron compounded signals 22a and 22b shown in the above figure (FIG. 4A).

The compounded signal 22a as an example of a signal comprising electrons having spins of both signs is formed by disposing individual bits each comprising electrons having + spins and individual bits each comprising electrons having − spins. The compound signal 22b is formed by disposing three types of bits, that is, individual bits each comprising electrons having + spins, individual bits each comprising electrons having − spins, and individual bits each comprising no electron or a little number of electrons compared to other bits such as a + bit and a − bit. A conventional electronic signal has only two types of bits, that is, 0 or 1. On the other hand, since another degree of freedom concerning a negative sign or a positive sign of each spin is added, various encodings will become possible in accordance with individual objects.

The dual-spin electron signal 22a or 22b thus obtained will be sent to the process for a next step. One example of such the process for the next step is storage in semiconductor memories. As another example of the process for the next step, a step for dividing a signal comprising electrons having spins whose every sign is either one of the two signs from the dual sign spin electronic signal will be shown in FIG. 4B.

Figure 5:
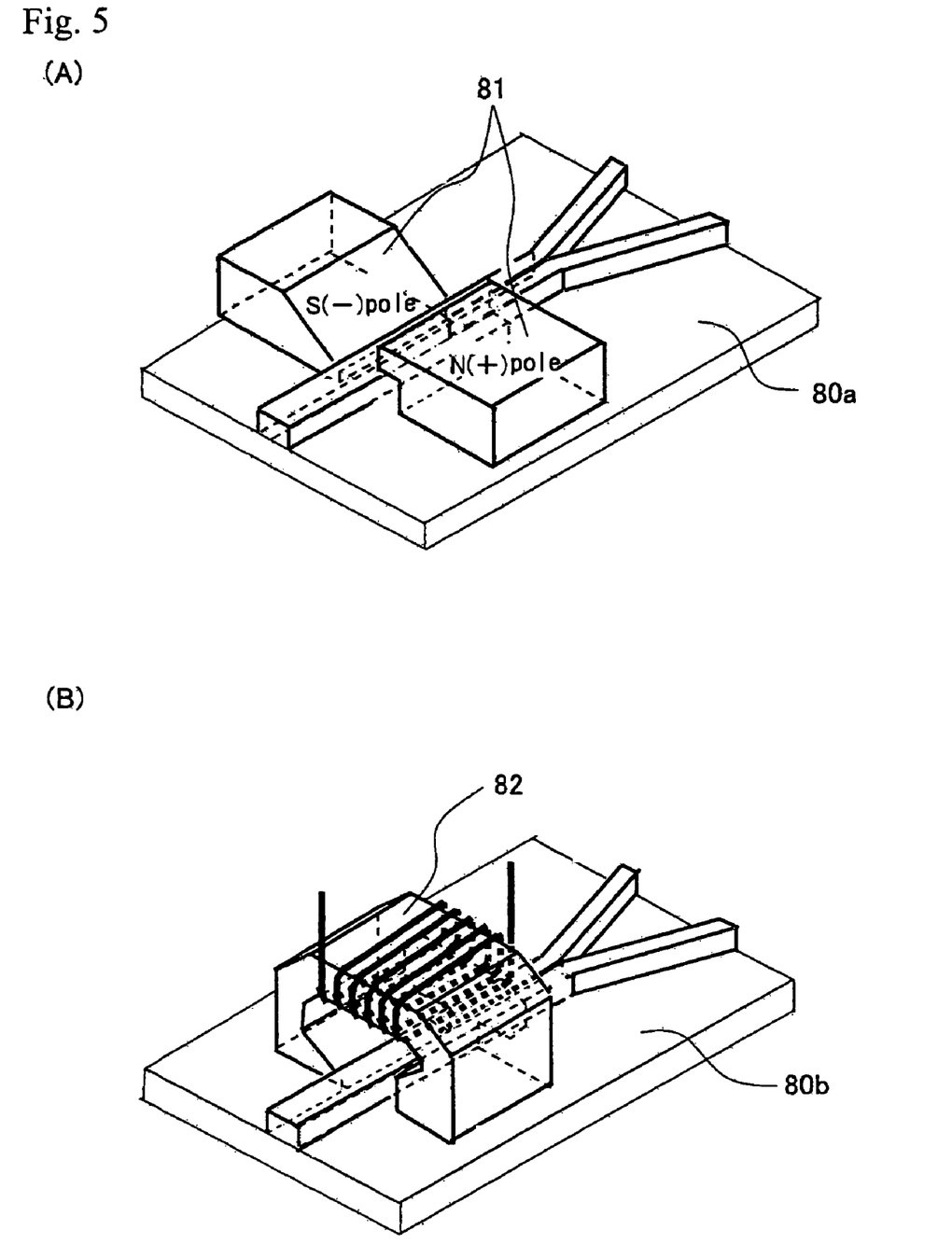

For example, the compounded signal 22a that has formed by the dual-spin electron signal compounding circuit shown in FIG. 4A is inputted into a conducting wire 30 as an input signal for a compounded signal dividing circuit shown in FIG. 4B. A signal current comprised of electrons having − spins, which is a part of the above compounded signal current, flows into a branched wire 31 and another signal current comprising electrons having + spins, which is another part of the above compounded signal current, flows into a branched wire 32 at the middle of the passage between the magnet poles of the electromagnet 3. Each individual electron signal formed by the electrons whose every sign has either one of the two signs will individually be sent as an input for a signal processing circuit in accordance with the object in the next step. In this way, when the apparatus shown in FIG. 4A is regarded as an encoding circuit, the apparatus shown in FIG. 4B works as a type of decoding circuit. Therefore, it becomes possible to compose a single-spin electron signal processing system by combining the apparatus shown individually in FIGS. 4A and 4B. Further, the combination of branched conducting wires and an electromagnet shown individually in FIGS. 4A and 4B can be unified on each of substrates 80a and 80b as shown for example in FIGS. 5A and 5B. In the example shown in FIG. 5A, a permanent magnet 81 made from a material such as a samarium cobalt is used and, in the example shown in FIG. 5B, an electromagnet 82 is used. In addition, by making use of a thin-film magnetic head as an electromagnet, both the branched conducting wires and the electromagnet can be produced in the manufacturing process utilizing photolithography.

Now, we consider the purity of spins with respect to a signal formed by electrons having either one of the + spins and − spins. For example, suppose that a signal of a bit comprises 10 electrons, in which a number of electrons having + spins is 8 and a number of electrons having − spins is 2. This signal can substantially be regarded as comprising 6 electrons having + spin. Therefore, it is not always necessary for the 10 electrons to have spins whose every sign is +.

Incidentally, as long as not deviating from the idea or scope of this invention, it is possible to make various alterations to the contents of concrete descriptions in the above embodiments.

INDUSTRIAL APPLICABILITY

According to this invention, since isolation of each individual particle in response to every specific sign of its spin becomes possible, it also becomes possible with the use of those particles whose every spin has either one of the two signs to create new raw materials that have never been in the natural world.

The invention claimed is:

1. A spin isolation apparatus which isolates particles each having a spin based on a sign of the spin of each of the particles, the apparatus comprising:
   a particle source which emits the particles;
   a receiving section which receives the particles emitted by the particle source;
   a Stern-Gerlach type electromagnet which has two magnet poles arranged apart from each other with a predetermined gap and which is placed between the particle source and the receiving section and which separates the particles into first particles each having a spin of a positive sign and second particles each having a spin of a negative sign; and
   a trajectory restricting section which restricts the trajectories of at least one of the first particles and the second particles only to a lateral direction (y) to isolate the first and second particles to be received by the receiving section.

2. The spin isolation apparatus according to claim 1, wherein the trajectory restricting section is a screen having an aperture with a predetermined width only in a lateral direction (v) and is placed between the electromagnet and the receiving section and in the vicinity of the receiving section.

3. The spin isolation apparatus according to claim 1, wherein the particles each having the spin neutrons, the trajectory restricting section restricts the trajectories of the neutrons to a lateral direction (v) so as to provide at least first neutrons each having the spin of the positive sign and second neutrons each having the spin of the negative sign, and the receiving section is formed by a neutron absorbing material.

4. A spin asymmetric substance produced by using a method which comprises:
   a step of arranging, one behind the other, a particle source which emits a beam of particles each having a spin, a Stern-Gerlach type electromagnet having two magnet poles arranged with a predetermined gap, and a substance to be a receiving section;
   a step of emitting the particles each having the spin from the particle source;
   a step of separating the particles each having the spin by use of a trajectory restricting section as defined in claim 2 into positive spin particles and negative spin particles by making the particles each having the spin pass through the predetermined gap; and
   a step of injecting, into the substance, one of the positive spin particles and the negative spin particles such that the injected particle is injected by a ratio greater than a predetermined ratio with respect to the other of the particles.

5. A method of producing a spin asymmetric substance in which a number of particles each having a positive spin and a number of particles each having a negative spin are different by a ratio greater than a predetermined ratio, the method comprising:
   a step of arranging, one behind the other, a particle source which emits a beam of particles each having a spin, a Stern-Gerlach type electromagnet having two magnet poles arranged with a predetermined gap, and a substance to be a receiving section;
   a step of emitting the particles each having the spin from the particle source;
   a step of separating the particles each having the spin into the particles each having the positive spin and the particles each having the negative spin by making the particles each having the spin pass through the gap defined in the electromagnet; and
   a step of injecting, into the substance, one of the particles each having the positive spin and the particles each having the negative spin such that the one of the particles is injected by the ratio greater than the predetermined ratio with respect to the other of the particles, wherein a trajectory restricting section having a predetermined width only in a lateral direction (v) is provided in front of the spin asymmetric substance.

6. A spin asymmetric substance produced by the method as defined in claim 5.

* * * * *

UNITED STATES PATENT AND TRADEMARK OFFICE
CERTIFICATE OF CORRECTION

PATENT NO.         : 8,101,920 B2
APPLICATION NO.    : 12/087152
DATED              : January 24, 2012
INVENTOR(S)        : Takashi Suzuki It is certified that error appears in the above-identified patent and that said Letters Patent is hereby corrected as shown below:

Claim 2; Column 15; Line 58 to Column 16; Line 1: Please replace "lateral direction (v)" with "lateral direction (y)"

Claim 3; Column 16; Line 6: Please replace "lateral direction (v)" with "lateral direction (y)"

Claim 5; Column 16; Line 52: Please replace "lateral direction (v)" with "lateral direction (y)"

Signed and Sealed this
Seventh Day of August, 2012

David J. Kappos
*Director of the United States Patent and Trademark Office*